US010217631B2

(12) United States Patent
Kim et al.

(10) Patent No.: US 10,217,631 B2
(45) Date of Patent: Feb. 26, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Han Kim, Suwon-si (KR); Mi Ja Han, Suwon-si (KR); Dae Hyun Park, Suwon-si (KR); Sang Jong Lee, Suwon-si (KR); Seong Hee Choi, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/673,149

(22) Filed: Aug. 9, 2017

(65) Prior Publication Data

US 2018/0138029 A1 May 17, 2018

(30) Foreign Application Priority Data

Nov. 17, 2016 (KR) ........................ 10-2016-0153532

(51) Int. Cl.
*H01L 21/02* (2006.01)
*H01L 21/48* (2006.01)
(Continued)

(52) U.S. Cl.
CPC ........ *H01L 21/0231* (2013.01); *H01L 21/486* (2013.01); *H01L 21/568* (2013.01);
(Continued)

(58) Field of Classification Search
CPC .................................................. H01L 21/0231
(Continued)

(56) References Cited

U.S. PATENT DOCUMENTS 9,337,073 B2 * 5/2016 Liu ......................... H01L 25/50
2009/0284947 A1 11/2009 Beddingfield et al.
(Continued)

FOREIGN PATENT DOCUMENTS

JP 2014-56925 A 3/2014
JP 2014-192452 A 10/2014
KR 10-2017-0112363 A 10/2017

OTHER PUBLICATIONS

Taiwanese Office Action issued in corresponding Taiwanese Patent Application No. 106126171, dated Apr. 25, 2018, with English Translation.

(Continued)

*Primary Examiner* — Igwe U Anya
(74) *Attorney, Agent, or Firm* — Morgan Lewis & Bockius LLP

(57) ABSTRACT

A fan-out semiconductor package includes: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip and including a redistribution layer electrically connected to the connection pads. The first connection member includes a first electromagnetic interference (EMI) blocking part surrounding side surfaces of the semiconductor chip, the second connection member includes a second EMI blocking part surrounding the redistribution layer, and the first EMI blocking part and the second EMI blocking part are connected to each other.

22 Claims, 18 Drawing Sheets

(51) Int. Cl.
*H01L 21/56* (2006.01)
*H01L 21/768* (2006.01)
*H01L 23/00* (2006.01)
*H01L 23/552* (2006.01)

(52) U.S. Cl.
CPC .. *H01L 21/76841* (2013.01); *H01L 21/76897* (2013.01); *H01L 23/552* (2013.01); *H01L 24/19* (2013.01); *H01L 2224/16225* (2013.01); *H01L 2224/19* (2013.01); *H01L 2224/32225* (2013.01); *H01L 2224/73204* (2013.01); *H01L 2924/10252* (2013.01); *H01L 2924/10253* (2013.01); *H01L 2924/10329* (2013.01); *H01L 2924/14* (2013.01); *H01L 2924/15311* (2013.01); *H01L 2924/181* (2013.01)

(58) Field of Classification Search
USPC .......................................................... 257/290
See application file for complete search history.

(56) References Cited

U.S. PATENT DOCUMENTS

2011/0186977 A1* 8/2011 Chi ........................ H01L 21/78
257/686
2013/0319731 A1 12/2013 Lee
2014/0070396 A1 3/2014 Kyozuka et al.
2014/0291859 A1 10/2014 Kiwanami et al.
2014/0312458 A1* 10/2014 Ashrafzadeh ....... H01L 23/3121
257/531
2014/0367160 A1* 12/2014 Yu ........................ H01L 21/568
174/377
2015/0016078 A1 1/2015 Yang et al.
2015/0348936 A1* 12/2015 Lin ...................... H01L 23/552
257/659
2016/0013148 A1 1/2016 Lin et al.
2016/0148904 A1* 5/2016 Zhai .................... H01L 21/4853
257/777
2017/0025364 A1* 1/2017 Yu ........................ H01L 21/568
2017/0077022 A1* 3/2017 Scanlan ............ H01L 23/49838
2017/0110413 A1* 4/2017 Chen .................. H01L 21/3205
2017/0287825 A1 10/2017 Lee et al.

OTHER PUBLICATIONS

Office Action issued in Korean Application No. 10-2016-0153532 dated Dec. 15, 2018 with English translation.

* cited by examiner

II-II'

FAN-OUT SEMICONDUCTOR PACKAGE

CROSS-REFERENCE TO RELATED APPLICATION(S)

This application claims benefit of priority to Korean Patent Application No. 10-2016-0153532 filed on Nov. 17, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

In accordance with a rapid increase in the use of various electronic devices and the development of digital technology, semiconductor technology, and the like, precise and complicated electronic devices have been used in a wide range of fields. In accordance with an increase in a density of internal components of the electronic devices, electromagnetic wave interference generated by individual components and a circuit board connecting the individual components to each other has caused a malfunction between the precise electronic devices as well as electromagnetic noise interference. In order to block noise that may cause electromagnetic wave interference, various methods have been used, and examples of such methods include a shield can, a film, an absorber sheet, and the like.

SUMMARY

An aspect of the present disclosure may provide a fan-out semiconductor package in which electromagnetic interference (EMI) blocking may be effectively performed.

According to an aspect of the present disclosure, a fan-out semiconductor package may be provided, in which blocking parts blocking EMI are introduced in a region in which a semiconductor chip is disposed and a region in which a redistribution layer is formed.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip and including a redistribution layer electrically connected to the connection pads. The first connection member includes a first electromagnetic interference (EMI) blocking part surrounding side surfaces of the semiconductor chip, the second connection member includes a second EMI blocking part surrounding the redistribution layer, and the first EMI blocking part and the second EMI blocking part are electrically connected to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
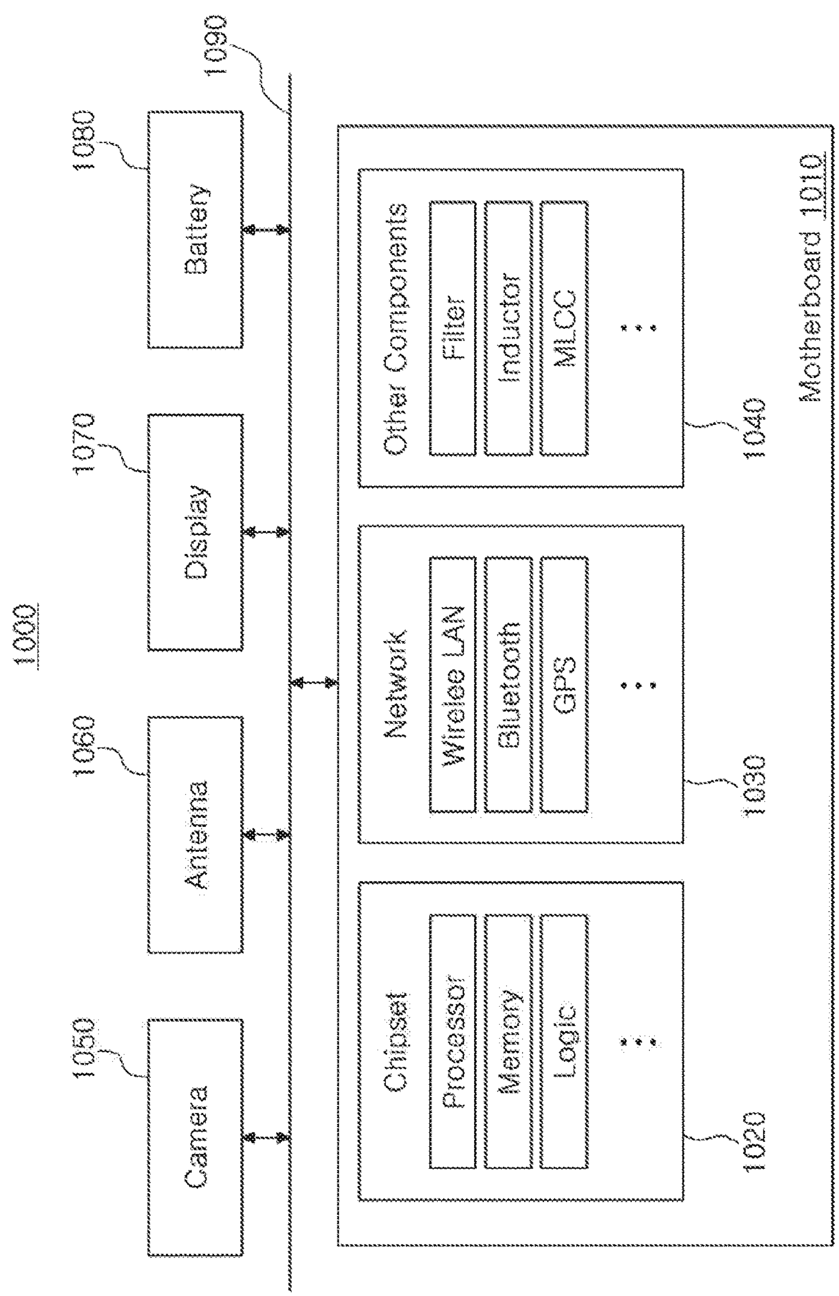
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
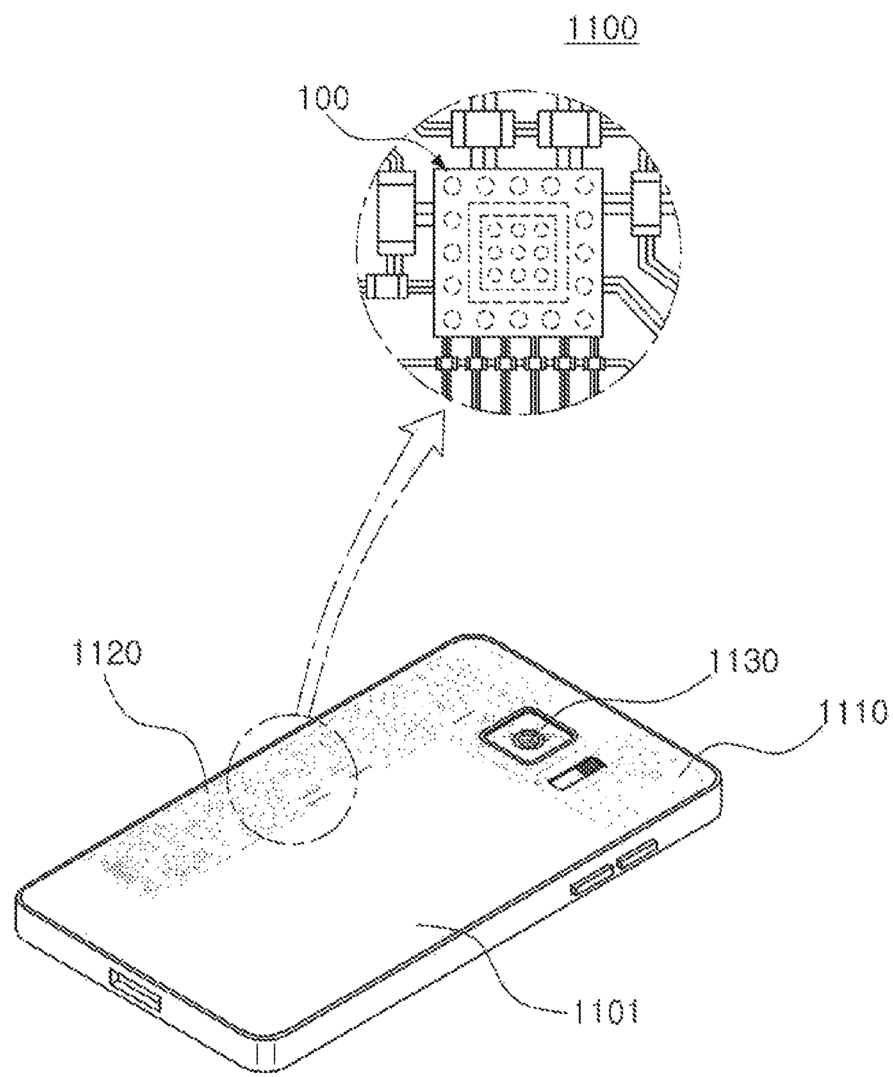
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figures 3A, 3B:
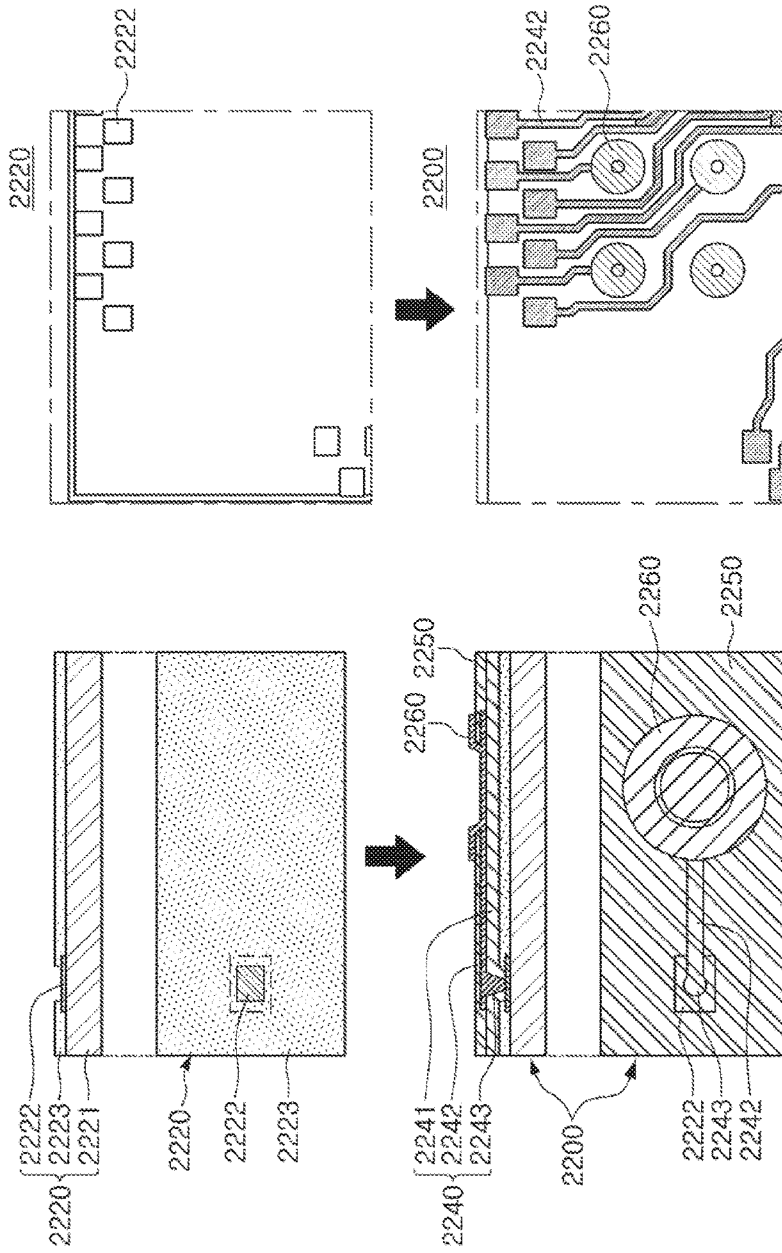
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
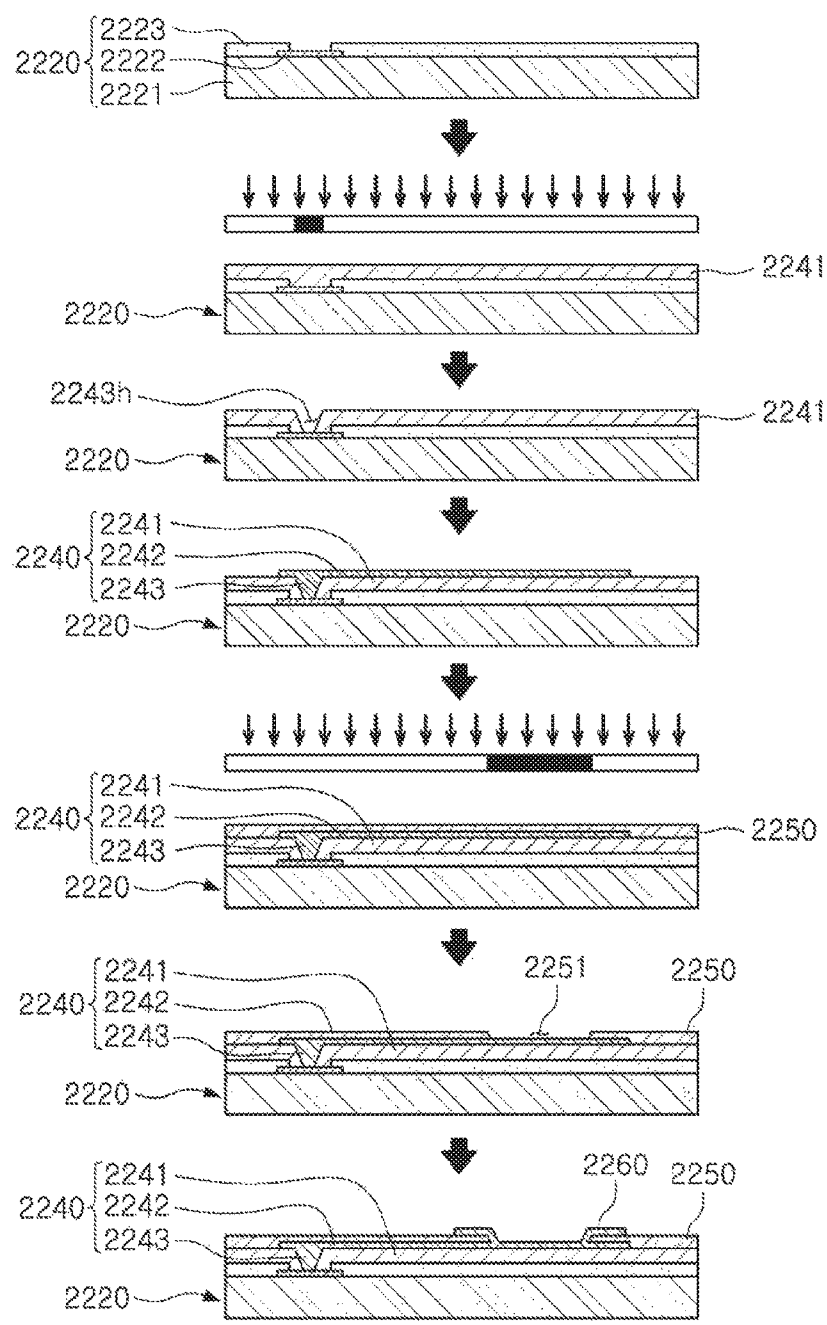
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
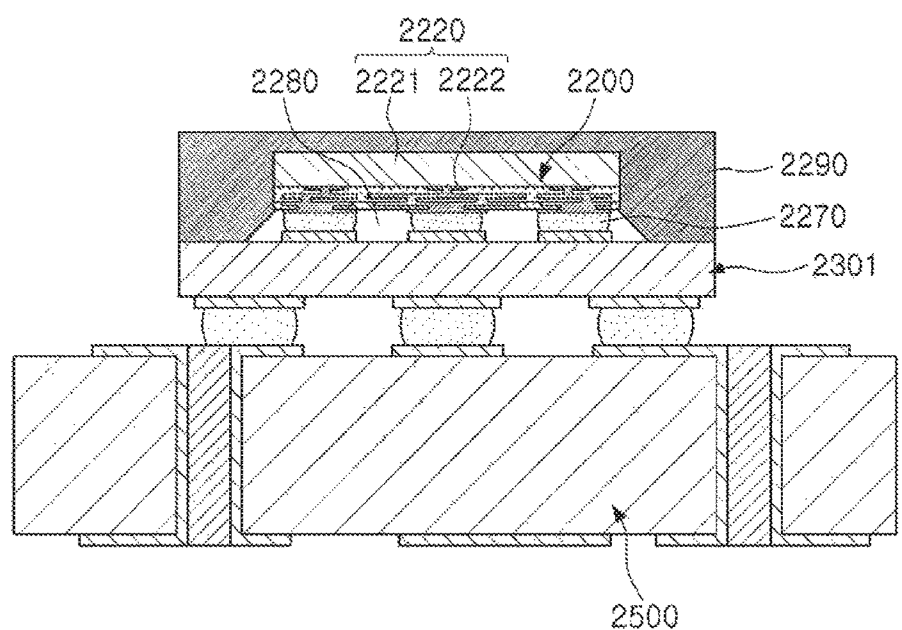
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
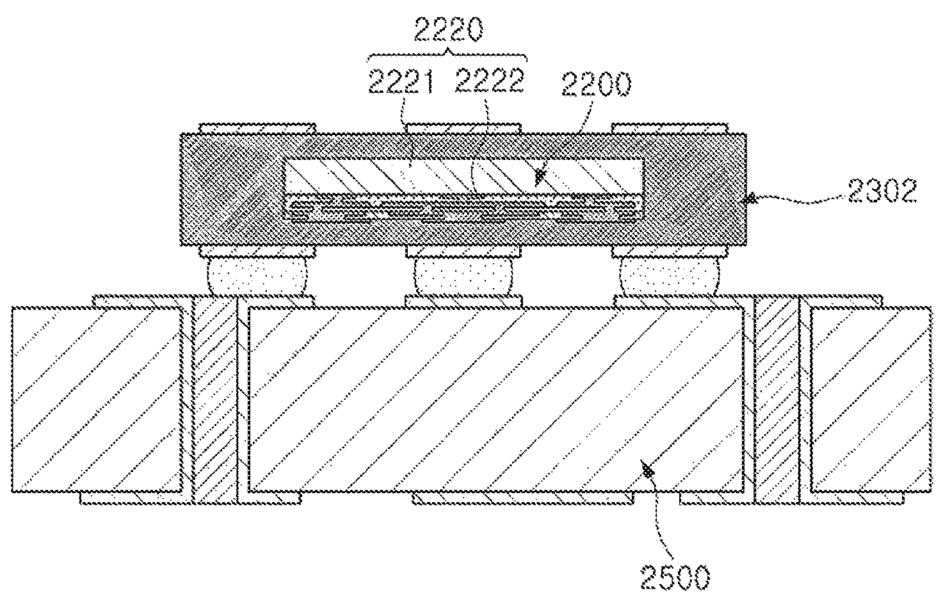
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may again be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may again be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and then mounted on the main board of the electronic device through a packaging process or may be mounted and used on the main board of the electronic device in a state in which it is embedded in the interposer substrate.

Fan-Out Semiconductor Package

Figure 7:
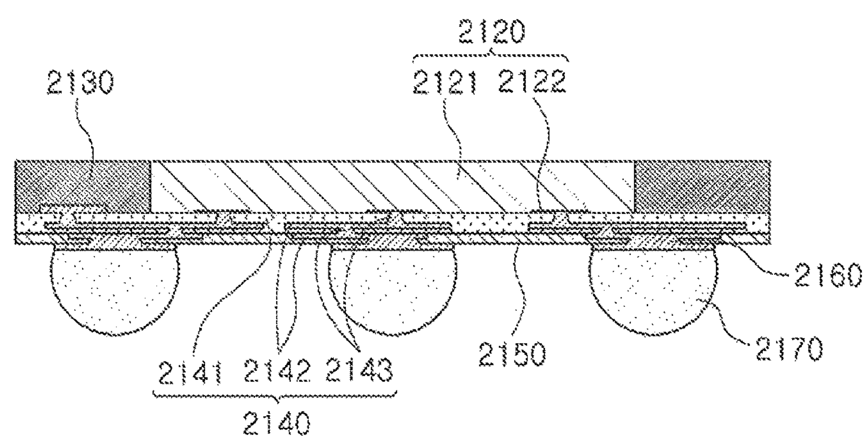
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
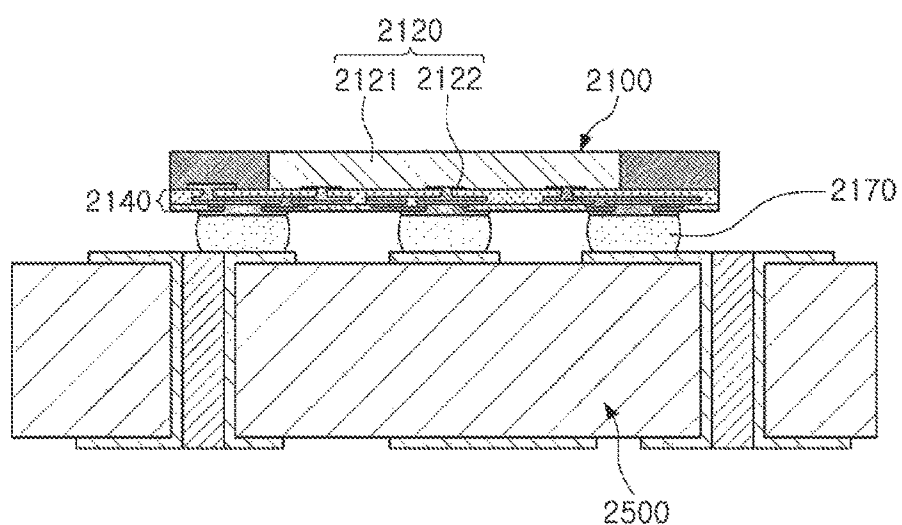
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which electromagnetic interference (EMI) blocking may be effectively performed and a heat dissipation effect is excellent will hereinafter be described with reference to the drawings.

Figure 9:
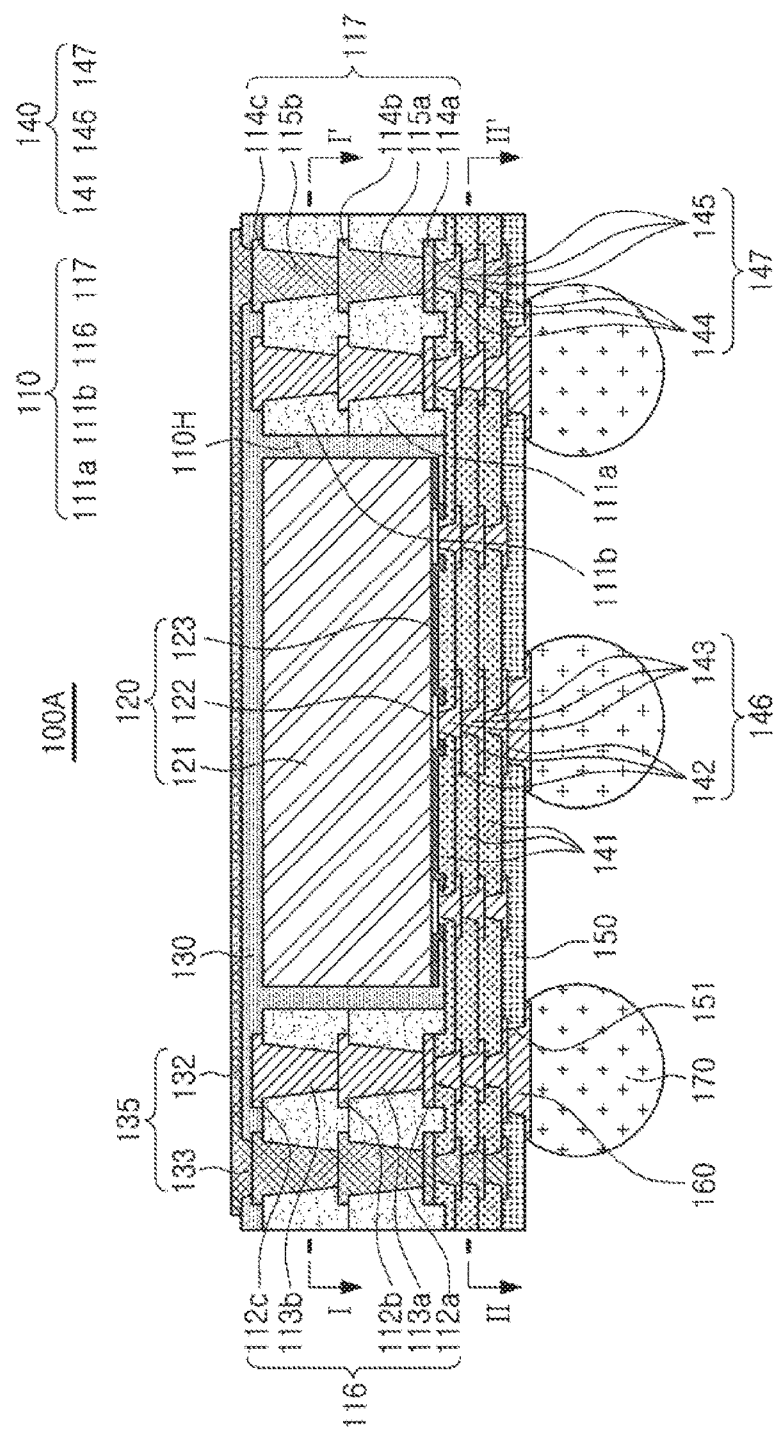
FIG. 9 is a schematic cross-sectional view illustrating an example of a fan-out semiconductor package.

FIG. 9 is a schematic cross-sectional view illustrating an example of a fan-out semiconductor package.

Figure 10A:
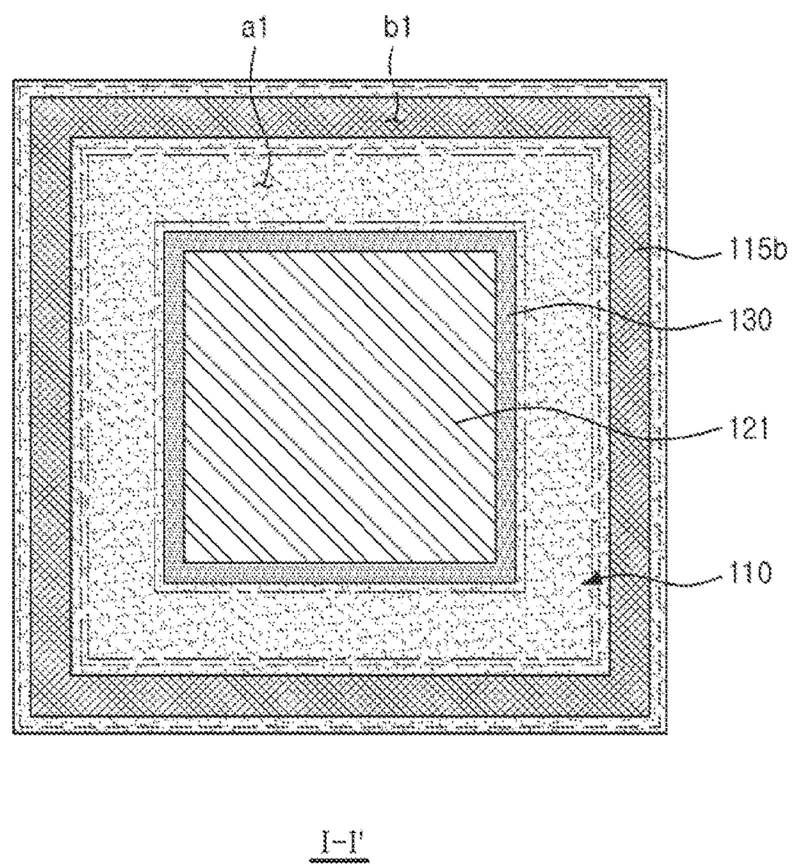
FIGS. 10A through 10C are various schematic plan views taken along line I-I' of the fan-out semiconductor package of FIG. 9.
Figure 10B:
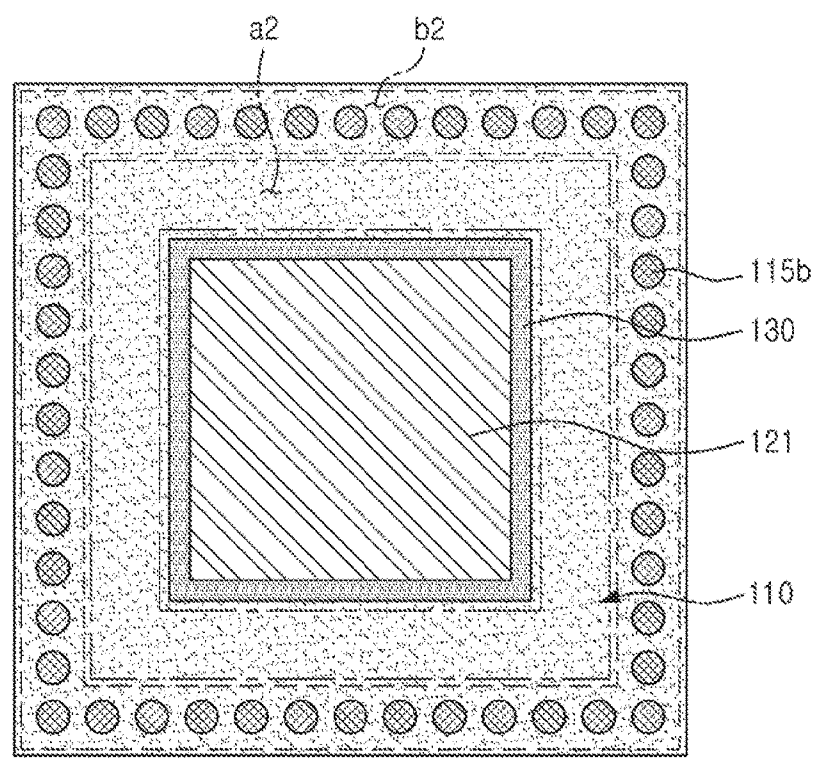
Figure 10C:
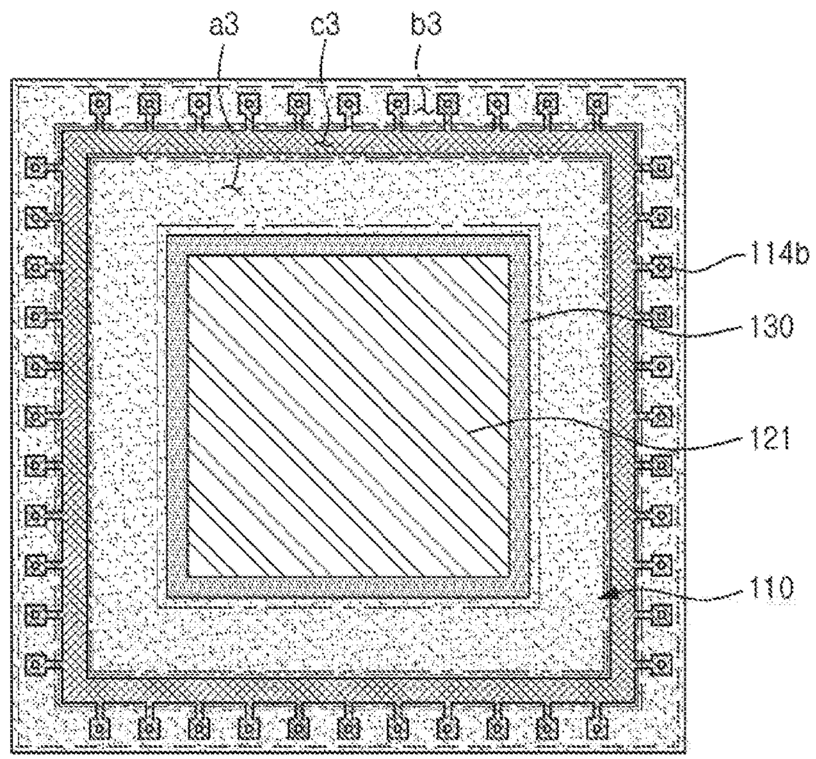

FIGS. 10A through 10C are various schematic plan views taken along line I-I' of the fan-out semiconductor package of FIG. 9.

Figure 11A:
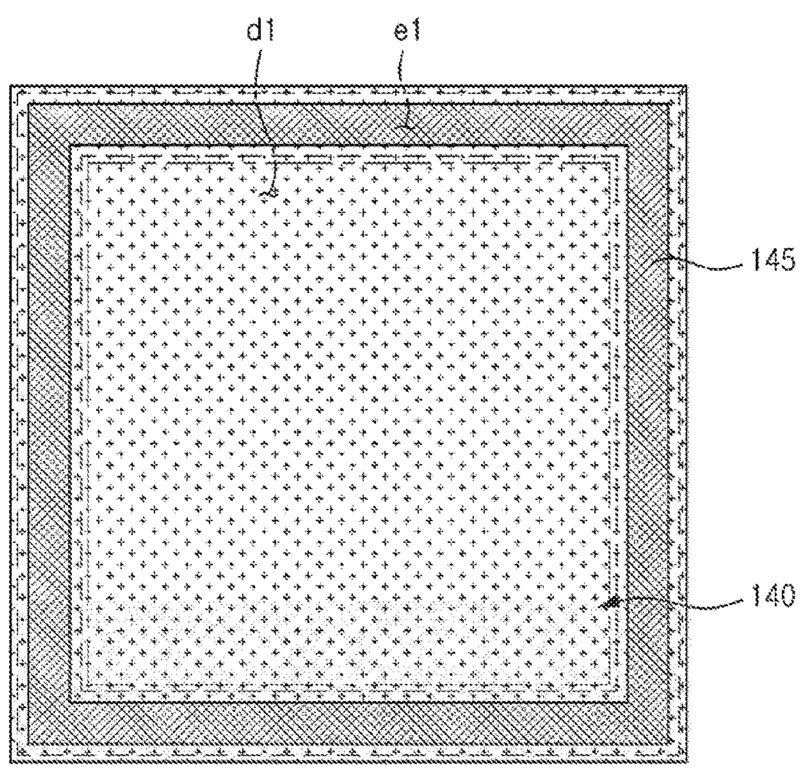
FIGS. 11A through 11C are various schematic plan views taken along line II-II' of the fan-out semiconductor package of FIG. 9.
Figure 11B:
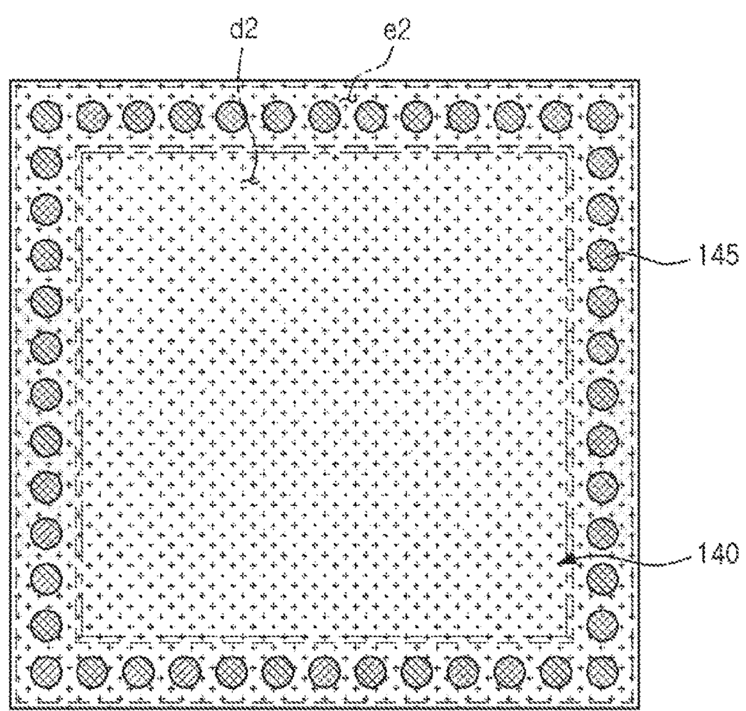
Figure 11C:
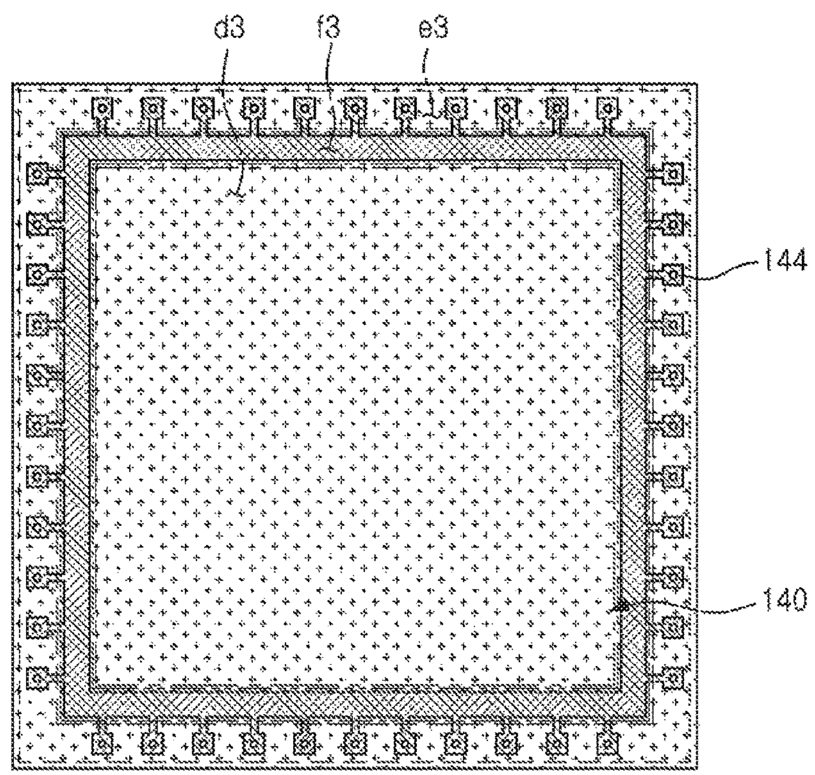

FIGS. 11A through 11C are various schematic plan views taken along line II-II' of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, an encapsulant 130 encapsulating at least portions of the first connection member 110 and the inactive surface of the semiconductor chip 120, and a second connection member 140 disposed on the first connection member 110 and the active surface of the semiconductor chip 120 and including redistribution layers 142 electrically connected to the connection pads 122. The first connection member 110 may include a first blocking part 117 surrounding side surfaces of the semiconductor chip 120. The second connection member 140 may include a second blocking part 147 surrounding the redistribution layers 142. The first blocking part 117 and the second blocking part 147 may be connected to each other.

In the semiconductor package according to the related art, an electromagnetic interference (EMI) blocking method was limited. Therefore, in a case of a semiconductor package of which EMI is large due to a large amount of radiated electromagnetic waves, a shield can was mounted to block the EMI. However, generation of incidental expenses and technical difficulty due to the EMI blocking, such as a reduction in a mounting area and generation of an additional cost due to the mounting of the shield can, an influence of noise between unit components in the shield can, and concentration of stress on a main board depending on a shield can mounting manner occurred. In addition, even though the shield can is mounted, an amount of electromagnetic waves radiated in a unit component level was continuously increased in accordance with an increase in high-speed signal transmission, such that a design optimizing process was performed several times in a set developing process in order to satisfy receiving sensitivity in a level actually required by communications companies, which is troublesome. Therefore, a structure and a method capable of effectively performing the EMI blocking in a unit component level of the semiconductor package have been demanded.

In the fan-out semiconductor package 100A according to the exemplary embodiment, the first blocking part 117 that may block the EMI may be continuously disposed in a kind of wall form along an outer edge of the first connection member 110 in the first connection member 110 to surround the semiconductor chip 120, a first signal part 116 in the first connection member 110, and the like. In addition, the second blocking part 147 that may block the EMI may be continuously disposed in a kind of wall form along an outer edge of the second connection member 140 in the second connection member 140 to surround a second signal part 146 in the second connection member 140, and the like. Therefore, noise radiation in an individual unit component level may be blocked without performing a special additional process, such that EMI blocking may be effectively performed and the shield can process according to the related art may be removed or be minimally used. Particularly, EMI generated by various redistribution layers 112*a*, 112*b*, 112*c*, and 142 as well as EMI generated by the semiconductor chip 120 may be blocked, such that an EMI blocking effect may be very excellent. In addition, in such a structure, the first blocking part 117 and/or the second blocking part 17 may also perform a heat dissipation function to improve a heat dissipation effect. The first blocking part 117 and/or the second blocking part 147 may be electrically connected to ground patterns formed in the first connection member 110 and/or the second connection member 140 to further improve design efficiency. The fan-out semiconductor package 100A may further include a third blocking part 135 covering at least portions of the inactive surface of the semiconductor chip 120, and the third blocking part 135 may be connected to the first blocking part 117 and the second blocking part 147. Therefore, an inner portion of the fan-out semiconductor package 100A may be surrounded by the first to third blocking parts, and an EMI blocking effect and a heat dissipation effect may thus be significantly improved.

The respective components included in the fan-out semiconductor package 100A according to the exemplary embodiment will hereinafter be described in more detail.

The first connection member 110 may maintain rigidity of the fan-out semiconductor package 100A depending on certain materials, and serve to secure uniformity of a thickness of the encapsulant 130. The fan-out semiconductor package 100A may be used as a portion of a package-on-package (POP) by the first connection member 110. The first connection member 110 may include redistribution layers 112*a*, 112*b*, and 112*c* to redistribute the connection pads 122 of the semiconductor chip 120 and reduce the number of layers of the second connection member 140. The semiconductor chip 120 may be disposed in the through-hole 110H to be spaced apart from the first connection member 110 by a predetermined distance. The side surfaces of the semiconductor chip 120 may be surrounded by the first connection member 110. However, such a form is only an example, and the through-hole 110H of the first connection member 110 may be variously modified to have other forms, and first connection member 110 may perform another function depending on such a form.

The first connection member 110 may include a first insulating layer 111*a* in contact with the second connection member 140, a first redistribution layer 112*a* in contact with the second connection member 140 and embedded in the first insulating layer 111*a*, a second redistribution layer 112*b* disposed on the other surface of the first insulating layer 111*a* opposing one surface of the first insulating layer 111*a* in which the first redistribution layer 112*a* is embedded, a second insulating layer 111*b* disposed on the first insulating layer 111*a* and covering the second redistribution layer 112*b*, and a third redistribution layer 112*c* disposed on the second insulating layer 111*b*. The first to third redistribution layers 112*a*, 112*b*, and 112*c* may be electrically connected to connection pads 122. The first and second redistribution layers 112*a* and 112*b* and the second and third redistribution layers 112*b* and 112*c* may be electrically connected to each other through first and second vias 113*a* and 113*b* penetrating through the first and second insulating layers 111*a* and 111*b*, respectively.

Since the first redistribution layer 112*a* is embedded in the first insulating layer 111*a*, an insulating distance of an insulating layer 141 of the second connection member 140 may be substantially constant. Since the first connection member 110 may include a large number of redistribution layers 112*a*, 112*b*, and 112*c*, the second connection member 140 may be simplified. Therefore, a decrease in a yield due to a defect occurring in a process of forming the second connection member 140 after the semiconductor chip 120 is disposed may be suppressed. The first redistribution layer 112*a* may be recessed in the first insulating layer 111*a*, such that a lower surface of the first insulating layer 111*a* and a lower surface of the first redistribution layer 112*a* may have a step therebetween. Resultantly, when an encapsulant 130 is formed, a phenomenon in which a material of the encapsulant 130 bleeds to pollute the first redistribution layer 112*a* may be prevented.

Thicknesses of the redistribution layers 112*a*, 112*b*, and 112*c* of the first connection member 110 may be greater than those of the redistribution layers 142 of the second connection member 140. Since the first connection member 110 may have a thickness equal to or greater than that of the semiconductor chip 120, the redistribution layers 112*a*, 112*b*, and 112*c* may be formed to have large sizes, depending on a scale of the first connection member 110. On the other hand, the redistribution layers 142 of the second connection member 140 may be formed at relatively small sizes for thinness.

A material of each of the insulating layers 111*a* and 111*b* is not particularly limited. For example, an insulating material may be used as the material of each of the insulating layers. In this case, the insulating material may be a thermosetting resin such as an epoxy resin, a thermoplastic resin such as a polyimide resin, an insulating material in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a photoimageable dielectric (PID) resin may also be used as the material of each of the insulating layers 111*a* and 111*b*.

The redistribution layers 112*a*, 112*b*, and 112*c* may serve to redistribute the connection pads 122 of the semiconductor chip 120, and a material of each of the redistribution layers 112*a*, 112*b*, and 112*c* may be a conductive material such as copper (Cu), aluminum (Al), silver (Ag), tin (Sn), gold (Au), nickel (Ni), lead (Pb), titanium (Ti), or alloys thereof. The redistribution layers 112*a*, 112*b*, and 112*c* may perform various functions depending on designs of their corresponding layers. For example, the redistribution layers 112*a*, 112*b*, and 112*c* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112*a*, 112*b*, and 112*c* may include various via pads, and the like.

The vias 113*a* and 113*b* may electrically connect the redistribution layers 112*a*, 112*b*, and 112*c* formed on different layers to each other, resulting in an electrical path in the first connection member 110. A material of each of the vias 113*a* and 113*b* may be a conductive material. Each of the vias 113*a* and 113*b* may be completely filled with the conductive material, or the conductive material may also be formed along a wall of each of via holes. In addition, each of the vias 113*a* and 113*b* may have all of the shapes known in the related art, such as a tapered shape, a cylindrical shape, and the like. Meanwhile, it may be advantageous in a process that each of the vias 113*a* and 113*b* has a tapered shape of which a width of an upper surface is greater than that of a lower surface.

The first connection member 110 may include the first signal part 116 and the first blocking part 117 surrounding the first signal part 116. The first signal part 116 may include patterns, vias, or the like, related to signals among the redistribution layers 112*a*, 112*b*, and 112*c* and the vias 113*a* and 113*b* described above. The first signal part 116 may also include patterns, vias, or the like, related to power or ground, if necessary. The first blocking part 117 may be continuously disposed along the outer edge of the first connection member 110 to surround inner portions of the fan-out semiconductor package 100A, such as the semiconductor chip 120, the first signal part 116, and the like, in order to block the EMI. The first blocking part 117 may have various forms, and may include, for example, line-vias continuously disposed without being disconnected along the outer edge of the first connection member 110, hole-vias spaced apart from each other by a predetermined interval and repeatedly disposed along the outer edge of the first connection member 110, or electromagnetic band gap (EBG)-patterns continuously formed along the outer edge of the first connection member 110.

In more detail, as illustrated in FIG. 10A, the first connection member 110 may include a signal region a1 in which various signal patterns, and the like, are formed and a blocking region b1 surrounding the signal region a1, and the first blocking part 117 including first line-vias 115*a* and 115*b* continuously disposed without being disconnected along the outer edge of the first connection member 110 may be disposed in the blocking region b1. The first line-vias 115*a* and 115*b* may be formed of a plurality of vias layers 115*a* and 115*b* each penetrating through a plurality of insulating layers 111*a* and 111*b* in the first connection member 110, and may be connected to pad patterns 114*a*, 114*b*, and 114*c*, or the like, formed on or in the plurality of insulating layers 111*a* and 111*b*.

Alternatively, as illustrated in FIG. 10B, the first connection member 110 may include a signal region a2 in which various signal patterns, and the like, are formed and a blocking region b2 surrounding the signal region a2, and the first blocking part 117 including first holes-vias 115*a* and 115*b* spaced apart from each other by a predetermined interval and repeatedly disposed along the outer edge of the first connection member 110 may be disposed in the blocking region b2. The first holes-vias 115*a* and 115*b* may be formed of a plurality of vias layers 115*a* and 115*b* each penetrating through a plurality of insulating layers 111*a* and 111*b* in the first connection member 110, and may be connected to pad patterns 114*a*, 114*b*, and 114*c*, or the like, formed on or in the plurality of insulating layers 111*a* and 111*b*.

Alternatively, as illustrated in FIG. 10C, the first connection member 110 may include a signal region a3 in which various signal patterns, and the like, are formed, a ground region c3 surrounding the signal region a3, and a blocking region b3 surrounding the ground region c3. The first blocking part 117 including first EBG-patterns 114*a*, 114*b*, and 114*c* spaced apart from each other by a predetermined interval and continuously disposed along the outer edge of the first connection member 110 may be disposed in the blocking region b3. The first EBG-patterns 114*a*, 114*b*, and 114*c* may be formed on or in a plurality of insulating layers 111*a* and 111*b*, and may be vertically connected to each other through a plurality of vias 115*a* and 115*b* each penetrating through the plurality of insulating layers 111*a* and 111*b*. Certain shapes of the first EBG-patterns 114*a*, 114*b*, and 114*c* are not particularly limited, and the EBG structure well-known in the related art may be applied to the EBG-patterns 114*a*, 114*b*, and 114*c* without being particularly limited. The first EBG-patterns 114*a*, 114*b*, and 114*c* may be connected to ground patterns formed in the ground region c3 to improve efficiency of a wiring design of the first connection member 110.

The semiconductor chip 120 may be an integrated circuit (IC) provided in an amount of several hundreds to several millions of elements, or more, integrated in a single chip. The IC may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like, but is not limited thereto.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. Meanwhile, the active surface refers to a surface of the semiconductor chip 120 on which the connection pads 122 are formed, and the inactive surfaces refers to a surface opposing the active surface.

The encapsulant 130 may protect the semiconductor chip 120. An encapsulation form of the encapsulant 130 is not particularly limited, and may be a form in which the encapsulant 130 surrounds at least portions of the semiconductor chip 120. For example, the encapsulant 130 may cover at least portions of the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Certain materials of the encapsulant 130 are not particularly limited. For example, an insulating material may be used as the certain materials of the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, the known molding material such as an epoxy molding compound (EMC), or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The third blocking part 135 may include a rear metal layer 132 disposed on the encapsulant 130 and covering at least portions of the inactive surface of the semiconductor chip 120 and rear vias 133 penetrating through the encapsulant 130 and connecting the rear metal layer 132 to the first blocking part 117. In this structure, most of the surface of the semiconductor chip 120 may be surrounded by a metal. Therefore, the EMI may be more effectively blocked, and a more excellent heat dissipation effect may be accomplished. The rear metal layer 132 and the rear vias 133 may be formed by a method of coating or plating the known metal such as copper (Cu). The metal layer 132 may also be utilized as a ground pattern, if necessary. The rear via 133 may be formed to have a form of a line via that is not disconnected, if necessary, in order to completely block the EMI.

However, the third blocking part 135 is not limited to including the rear metal layer 132 and the rear vias 133, but may be a dielectric layer including a magnetic filler in some cases. That is, the third blocking part 135 may also be formed by applying the dielectric layer including the magnetic filler onto the encapsulant 130. Alternatively, the third blocking part 135 may have an electromagnetic band gap (EBG) structure. That is, the third blocking part 135 may also be formed by the EBG structure on the encapsulant 130.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through connection terminals 170 to be described below depending on the functions. The second connection member 140 may include insulating layers 141, the redistribution layers 142 disposed on the insulating layer 141, and vias 143 penetrating through the insulating layers 141 and connected to the redistribution layers 142.

A material of each of the insulating layers 141 may be an insulating material. In this case, a photosensitive insulating material such as a PID resin may also be used as the insulating material. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various kinds of pad patterns, and the like.

The vias 143 may electrically connect the connection pads 122, the redistribution layers 142, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The second connection member 140 may include the second signal part 146 and the second blocking part 147 surrounding the second signal part 146. The second signal part 146 may include patterns, vias, or the like, related to signals among the redistribution layers 142 and the vias 143 described above. The first signal part 116 may also include patterns, vias, or the like, related to power or ground, if necessary. The second blocking part 147 may be continuously disposed along the outer edge of the second connection member 140 to surround inner portions of the fan-out semiconductor package 100A, such as the second signal part 146, and the like, in order to block the EMI. The second blocking part 147 may have various forms, and may include, for example, line-vias continuously disposed without being disconnected along the outer edge of the second connection member 140, hole-vias spaced apart from each other by a predetermined interval and continuously disposed along the outer edge of the second connection member 140, or EBG-patterns continuously formed along the outer edge of the second connection member 140.

In more detail, as illustrated in FIG. 11A, the second connection member 140 may include a signal region d1 in which various signal patterns, and the like, are formed and a blocking region e1 surrounding the signal region d1, and the second blocking part 147 including second line-vias 145 continuously disposed without being disconnected along the outer edge of the second connection member 140 may be disposed in the blocking region e1. The second line-vias 145 may be formed of a plurality of via layers 145 each penetrating through a plurality of insulating layers 141 in the second connection member 140, and may be connected to pad patterns 144 formed on or in the plurality of insulating layers 141.

Alternatively, as illustrated in FIG. 11B, the second connection member 140 may include a signal region d2 in which various signal patterns, and the like, are formed and a blocking region e2 surrounding the signal region d2, and the second blocking part 147 including second hole-vias 145 spaced apart from each other by a predetermined interval and repeatedly disposed along the outer edge of the second connection member 140 may be disposed in the blocking region e2. The second hole-vias 145 may be formed of a plurality of via layers 145 each penetrating through a plurality of insulating layers 141 in the second connection member 140, and may be connected to pad patterns 144 formed on or in the plurality of insulating layers 141.

Alternatively, as illustrated in FIG. 11C, the second connection member 140 may include a signal region d3 in which various signal patterns, and the like, are formed, a ground region f3 surrounding the signal region d3, and a blocking region e3 surrounding the ground region f3, and the second blocking part 147 including second EBG-patterns 144 spaced apart from each other by a predetermined interval and continuously disposed along the outer edge of the second connection member 140 may be disposed in the blocking region e3. The second EBG-patterns 144 may be formed on or in a plurality of insulating layers 141, and may be vertically connected to each other through a plurality of via layers 145 each penetrating through the plurality of insulating layers 141. Certain shapes of the second EBG-patterns 144 are not particularly limited, and the EBG structure well-known in the related art may be applied to the EBG-patterns 144 without being particularly limited. The second EBG-patterns 144 may be connected to ground patterns formed in the ground region f3 to improve efficiency of a wiring design of the second connection member 140. A passivation layer 150 may be additionally configured to protect the second connection member 140 from external physical or chemical damage. The passivation layer 150 may have openings 151 exposing at least portions of the redistribution layer 142 of the second connection member 140. The openings may be provided in an amount of several tens to several thousands. A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150. When the insulating material including the inorganic filler and the insulating resin, such as the ABF, or the like, is used as the material of the passivation layer 150, the insulating layer 141 of the second connection member 140 may also include an inorganic filler and an insulating resin. In this case, a weight percentage of the inorganic filler included in the passivation layer 150 may be greater than that of the inorganic filler included in the insulating layer 141 of the second connection member 140. In this case, the passivation layer 150 may have a relatively low coefficient of thermal expansion (CTE), and may be utilized to control the warpage.

An underbump metal layer 160 may be additionally configured to improve connection reliability of the connection terminals 170 and improve board level reliability of the fan-out semiconductor package 100A. The underbump metal layer 160 may be connected to the redistribution layer 142 of the second connection member 140 opened through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Figure 12:
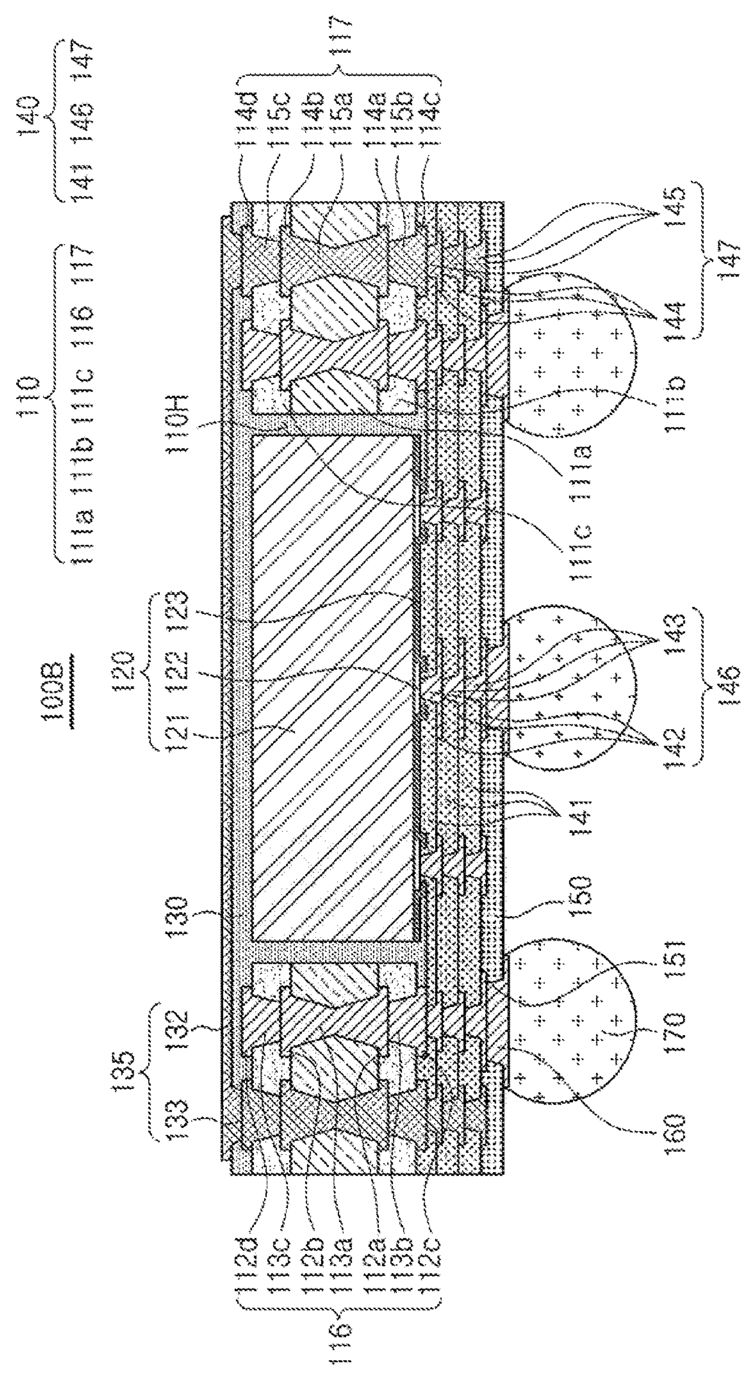
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, a first connection member 110 may include a first insulating layer 111*a*, a first redistribution layer 112*a* and a second redistribution layer 112*b* disposed on opposite surfaces of the first insulating layer 111*a*, respectively, a second insulating layer 111*b* disposed on the first insulating layer 111*a* and covering the first redistribution layer 112*a*, a third redistribution layer 112*c* disposed on the second insulating layer 111*b*, a third insulating layer 111*c* disposed on the first insulating layer 111*a* and covering the second redistribution layer 112*b*, and a fourth redistribution layer 112*d* disposed on the third insulating layer 111*c*, unlike the fan-out semiconductor package 100A illustrated in FIG. 9. Since the first connection member 110 may include a larger number of redistribution layers 112*a*, 112*b*, 112*c*, and 112*d*, a second connection member 140 may be further simplified. The first to fourth redistribution layers 112*a*, 112*b*, 112*c*, and 112*d* may be electrically connected to each other through first to third vias 113*a*, 113*b*, and 113*c* penetrating through the first to third insulating layers 111*a*, 111*b*, and 111*c*, respectively.

The first insulating layer 111*a* may have a thickness greater than those of the second insulating layer 111*b* and the third insulating layer 111*c*. The first insulating layer 111*a* may be basically relatively thick in order to maintain rigidity, and the second insulating layer 111*b* and the third insulating layer 111*c* may be introduced in order to form a larger number of redistribution layers 112*c* and 112*d*. The first insulating layer 111*a* may include an insulating material different from those of the second insulating layer 111*b* and the third insulating layer 111*c*. For example, the first insulating layer 111*a* may be, for example, prepreg including a core material, an inorganic filler, and an insulating resin, and the second insulating layer 111*b* and the third insulating layer 111*c* may be an ABF or a photosensitive insulating film including an inorganic filler and an insulating resin. However, the materials of the first insulating layer 111*a* and the second and third insulating layers 111*b* and 111*c* are not limited thereto. Similarly, the first via 113*a* may have a diameter greater than those of the second via 113*b* and the third via 113*c*.

Thicknesses of the redistribution layers 112*a*, 112*b*, 112*c*, and 112*d* of the first connection member 110 may be greater than those of redistribution layers 142 of the second connection member 140. Since the first connection member 110 may have a thickness equal to or greater than that of a semiconductor chip 120, the redistribution layers 112*a*, 112*b*, 112*c*, and 112*d* may also be formed at large sizes. On the other hand, the redistribution layers 142 of the second connection member 140 may be formed at relatively small sizes for thinness.

Since the first connection member 110 includes a larger number of layers, a first blocking part 117 may also include a larger number of via layers 115*a*, 115*b*, and 115*c* and a larger number of pattern layers 114*a*, 114*b*, 114*c*, and 114*d*. The first blocking part 117 may have the form of the line-vias, the forms of the hole-vias, or the form of the EBG-patterns as described above. A description of other configurations overlaps that described above, and is thus omitted.

Figure 13:
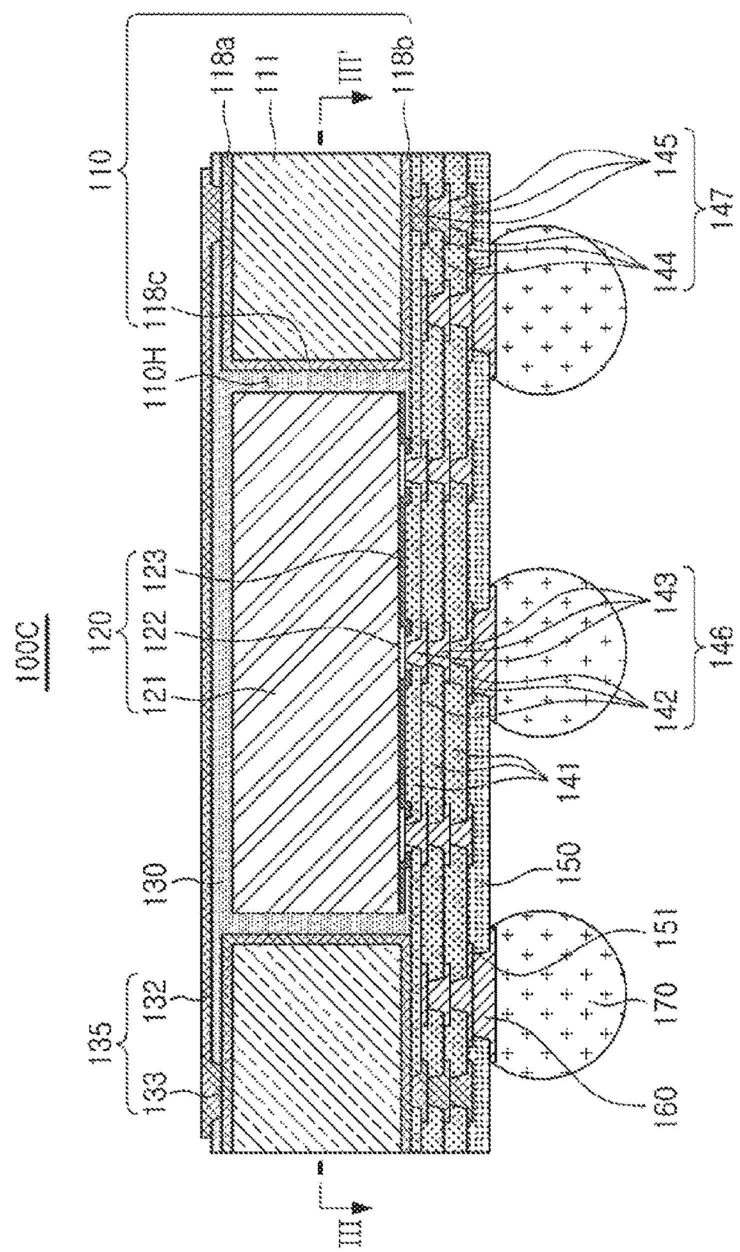
FIG. 13 is a schematic cross-sectional view illustrating another example of a fan-out semiconductor package.
Figure 14:
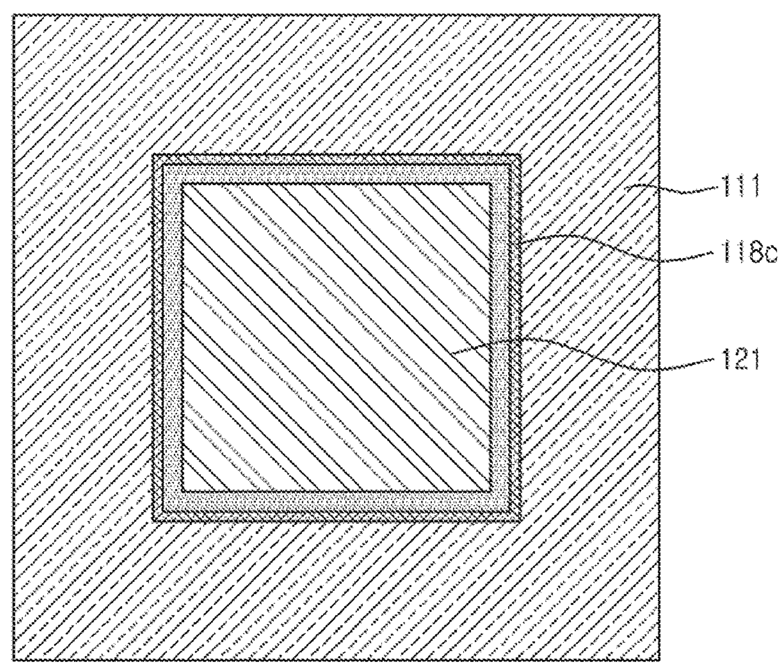
FIG. 14 is a schematic plan view taken along line III-III' of the fan-out semiconductor package of FIG. 13.

FIG. 13 is a schematic cross-sectional view illustrating another example of a fan-out semiconductor package. FIG. 14 is a schematic plan view taken along line III-III' of the fan-out semiconductor package of FIG. 13.

Referring to the drawing, in a fan-out semiconductor package 100C according to another exemplary embodiment in the present disclosure, a first connection member 110 may include a single insulating layer 111 and first to third metal layers 118*a*, 118*b*, and 118*c* formed on the insulating layer 111, unlike the fan-out semiconductor package 100A illustrated in FIG. 9. The first metal layer 118*a* may be formed on walls of a through-hole 110H, and may surround side surfaces of a semiconductor chip 120. The second metal layer 118*b* and the third metal layer 118*c* may extend to an upper surface and a lower surface of the insulating layer 111, respectively, and may be connected to the first metal layer 118*a*. The first to third metal layers 118*a*, 118*b*, and 118*c* may be formed of a conductive material such as copper (Cu), and may be formed by the known plating process, or the like. The first to third metal layers 118*a*, 118*b*, and 118*c* may also have the functions of the blocking parts described above, such as the EMI blocking function and the heat dissipation function. A description of other configurations overlaps that described above, and is thus omitted.

As set forth above, according to the exemplary embodiments in the present disclosure, a fan-out semiconductor package in which the EMI blocking may be effectively performed and the heat dissipation effect is excellent may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:

a first connection member having a through-hole, and including first redistribution layers and a first electromagnetic interference (EMI) blocking part;

a semiconductor chip disposed in the through-hole of the first connection member and having an active surface having connection pads disposed thereon and an inactive surface opposing the active surface;

an encapsulant encapsulating at least portions of the first connection member and the inactive surface of the semiconductor chip, and including a portion filling in a portion of the through-hole to separate side surfaces of the semiconductor chip from the first connection member; and a second connection member disposed on the first connection member and the active surface of the semiconductor chip, and including a second redistribution layer and a second EMI blocking part, wherein the first electromagnetic interference (EMI) blocking part surrounds the side surfaces of the semiconductor chip, the first redistribution layers are disposed between the first EMI blocking part and the semiconductor chip, the second EMI blocking part surrounds the second redistribution layer, a signal pattern of the first redistribution layers is electrically connected to one of the connection pads through a signal pattern of the second redistribution layer, and the first EMI blocking part and the second EMI blocking part are electrically connected to each other, and are electrically isolated from the signal patterns of the first and second redistribution layers.

2. The semiconductor package of claim 1, wherein the first redistribution layers of the first connection member further include ground patterns, and the first EMI blocking part is electrically connected to the ground patterns of the first redistribution layers of the first connection member.

3. The fan-out semiconductor package of claim 1, wherein the second EMI blocking part includes a second line-via continuously disposed without being disconnected along an entire outer edge of the second connection member.

4. The semiconductor package of claim 1, wherein the second redistribution layer of the second connection member further includes ground patterns, and the second EMI blocking part is electrically connected to the ground patterns of the second redistribution layer of the second connection member.

5. The semiconductor package of claim 1, further comprising a third EMI blocking part covering at least portions of the inactive surface of the semiconductor chip, wherein the first EMI blocking part, the second EMI blocking part, and the third EMI blocking part are electrically connected to each other.

6. The semiconductor package of claim 5, wherein the third EMI blocking part includes a rear metal layer disposed on the encapsulant and covering at least portions of the inactive surface of the semiconductor chip and rear vias penetrating through the encapsulant and connecting the rear metal layer to the first EMI blocking part, and the rear metal layer extends continuously between the rear vias to cover the inactive surface of the semiconductor chip and the portion of the encapsulant filling the portion of the through-hole.

7. The semiconductor package of claim 1, wherein the first connection member further includes a first insulating layer, one of the first redistribution layers is in contact with the second connection member and embedded in the first insulating layer, another of the first redistribution layers is disposed on the other surface of the first insulating layer opposing one surface of the first insulating layer in which the one of the first redistribution layers is embedded, and the first redistribution layers are electrically connected to the connection pads.

8. The semiconductor package of claim 7, wherein the first connection member further includes a second insulating layer disposed on the first insulating layer and covering the another of the first redistribution layers and a third redistribution layer disposed on the second insulating layer, and the third redistribution layer is electrically connected to the connection pads.

9. The semiconductor package of claim 7, wherein a lower surface of the one of the first redistribution layers has a step with respect to a lower surface of the first insulating layer.

10. The semiconductor package of claim 1, wherein the first connection member further includes a first insulating layer, a second insulating layer disposed on the first insulating layer, and a third redistribution layer disposed on the second insulating layer, one of the first redistribution layers and another of the first redistribution layers are disposed on opposite surfaces of the first insulating layer, respectively, the second insulating layer covers the one of the first redistribution layers, the first and third redistribution layers are electrically connected to the connection pads.

11. The semiconductor package of claim 10, wherein the first connection member further includes a third insulating layer disposed on the first insulating layer and covering the another of the first redistribution layers and a fourth redistribution layer disposed on the third insulating layer, and the fourth redistribution layer is electrically connected to the connection pads.

12. The semiconductor package of claim 10, wherein the first insulating layer has a thickness greater than that of the second insulating layer.

13. The semiconductor package of claim 1, wherein the first redistribution layer and the first electromagnetic interference (EMI) blocking part are embedded in an insulating layer of the first connection member.

14. The semiconductor package of claim 13, wherein the first EMI blocking part includes a first line-via continuously disposed along an entire outer edge of the first connection member without being disconnected.

15. The semiconductor package of claim 13, wherein the first EMI blocking part includes a plurality of first hole-vias spaced apart from each other by a predetermined interval and repeatedly disposed along the outer edge of the first connection member.

16. The semiconductor package of claim 13, wherein the first EMI blocking part includes a plurality of first electromagnetic band gap-patterns continuously extending along an entire outer edge of the first connection member.

17. The semiconductor package of claim 1, wherein the second EMI blocking part includes a plurality of second hole-vias spaced apart from each other by a predetermined interval and repeatedly disposed along an outer edge of the second connection member.

18. The semiconductor package of claim 1, wherein the second EMI blocking part includes a plurality of second electromagnetic band gap-patterns continuously extending along an entire outer edge of the second connection member.

19. The semiconductor package of claim 1, further comprising a passivation layer disposed on the second connection member and including openings opening portions of the second redistribution layer, wherein at least one of the openings of the passivation layer is disposed on a fan-out region.

20. A semiconductor package comprising:

a first connection member having a through-hole;

a semiconductor chip disposed in the through-hole of the first connection member and having an active surface having connection pads disposed thereon and an inactive surface opposing the active surface;

an encapsulant encapsulating at least portions of the first connection member and the inactive surface of the semiconductor chip, and including a portion filling in a portion of the through-hole to separate side surfaces of the semiconductor chip from the first connection member; and a second connection member disposed on the first connection member and the active surface of the semiconductor chip and including a redistribution layer electrically connected to the connection pads, wherein the first connection member includes a first electromagnetic interference (EMI) blocking part disposed on walls of the through-hole and spaced apart from the side surfaces of the semiconductor chip by the portion of the encapsulant filling the portion of the through-hole, the second connection member includes a second EMI blocking part surrounding the redistribution layer of the second connection member, and the first EMI blocking part and the second EMI blocking part are electrically connected to each other.

21. The semiconductor package of claim 20, wherein the first EMI blocking part includes a first metal layer disposed the walls of the through-hole, a second metal layer and a third metal layer extending, respectively, to an upper portion and a lower portion of the first connection member, and the third metal layer connects the first metal layer and the second EMI blocking part to each other.

22. The semiconductor package of claim 21, wherein the third EMI blocking part includes a rear metal layer disposed on the encapsulant and covering at least portions of the inactive surface of the semiconductor chip and rear vias penetrating through the encapsulant and connecting the rear metal layer to the second metal layer of first EMI blocking part, and the rear metal layer extends continuously between the rear vias to cover the inactive surface of the semiconductor chip and the portion of the encapsulant filling the portion of the through-hole.

* * * * *